(12) United States Patent
Augarten

(10) Patent No.: US 6,536,005 B1
(45) Date of Patent: Mar. 18, 2003

(54) HIGH-SPEED FAILURE CAPTURE APPARATUS AND METHOD FOR AUTOMATIC TEST EQUIPMENT

(75) Inventor: Michael H. Augarten, Santa Barbara, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/426,486

(22) Filed: Oct. 26, 1999

(51) Int. Cl.[7] .................. G11C 29/00; G11C 7/00
(52) U.S. Cl. ...................... 714/723; 365/201
(58) Field of Search ................. 714/723, 718, 714/719, 710; 365/200, 201

(56) References Cited

U.S. PATENT DOCUMENTS

| | | | | |
|---|---|---|---|---|
| 4,460,997 A | * | 7/1984 | Harns .................. | 714/704 |
| 4,460,999 A | * | 7/1984 | Schmidt ................ | 714/711 |
| 4,628,509 A | * | 12/1986 | Kawaguchi ............ | 714/711 |
| 4,876,685 A | | 10/1989 | Rich ..................... | 714/723 |
| 5,195,057 A | * | 3/1993 | Kasa et al. ........... | 365/189.07 |
| 5,317,573 A | | 5/1994 | Bula et al. ............ | 714/711 |
| 5,588,115 A | | 12/1996 | Augarten ............. | 395/183.05 |
| 5,610,925 A | | 3/1997 | Takahashi ............ | 714/724 |
| 5,644,578 A | * | 7/1997 | Ohsawa ................ | 714/719 |
| 5,717,694 A | | 2/1998 | Ohsawa ................ | 714/704 |
| 5,720,031 A | | 2/1998 | Lindsay ................ | 714/42 |
| 5,754,556 A | | 5/1998 | Ramseyer et al. ... | 714/711 |
| 5,757,815 A | | 5/1998 | Shimogama et al. . | 714/718 |
| 5,790,559 A | * | 8/1998 | Sato ..................... | 714/720 |
| 5,795,797 A | | 8/1998 | Chester et al. ....... | 438/4 |
| 5,831,989 A | * | 11/1998 | Fujisaki ............... | 714/723 |
| 5,835,428 A | * | 11/1998 | Kobayashi ........... | 365/201 |
| 5,862,088 A | * | 1/1999 | Takemoto et al. ... | 365/189.01 |
| 5,889,936 A | | 3/1999 | Chan ................... | 395/183.15 |
| 5,909,448 A | | 6/1999 | Takahashi ........... | 714/719 |
| 5,996,098 A | * | 11/1999 | Takano ................ | 711/100 |
| 6,047,393 A | * | 4/2000 | Yamada ............... | 714/718 |
| 6,049,898 A | * | 4/2000 | Sugiyama et al. ... | 714/42 |
| 6,097,206 A | * | 8/2000 | Takano ................ | 324/765 |
| 6,115,833 A | * | 9/2000 | Sato et al. ........... | 365/201 |
| 6,154,862 A | * | 11/2000 | Tabata et al. ....... | 714/42 |
| 6,173,238 B1 | * | 1/2001 | Fujisaki .............. | 365/230.01 |
| 6,314,536 B1 | * | 11/2001 | Kurosaki ............ | 714/718 |

FOREIGN PATENT DOCUMENTS

DE         19851861 A     5/1999     ........... G11C/29/00

* cited by examiner

Primary Examiner—Albert Decady
Assistant Examiner—Joseph D. Torres
(74) Attorney, Agent, or Firm—Lance M. Kreisman

(57) ABSTRACT

A failure capture circuit for use in a failure processing circuit to identify failure location information from a memory-under-test (MUT) is disclosed. The failure capture circuit includes failure detection circuitry comprising a plurality of channels and adapted for coupling to the MUT. The failure detection circuitry is operative to apply test signals to the MUT and process output signals therefrom into failure information. A failure memory circuit and a high speed link are provided to minimize test time. The high-speed link couples the failure memory circuit to the failure detection circuitry to provide serial data transfer capability therebetween.

13 Claims, 5 Drawing Sheets

FIG. 5

HIGH-SPEED FAILURE CAPTURE APPARATUS AND METHOD FOR AUTOMATIC TEST EQUIPMENT

FIELD OF THE INVENTION

The invention relates generally to automatic test equipment for testing semiconductor devices, and more particularly a high-speed failure capture apparatus and method for use in a semiconductor device tester.

BACKGROUND OF THE INVENTION

Semiconductor memory manufacturers continuously seek to minimize the costs of producing memory devices in order to remain competitive. One of the more important fabrication processes involves testing each device to ensure reliability and operability under various conditions. The equipment utilized to carry out the testing is often referred to as automatic test equipment, or "testers".

Conventional testers generally include circuitry that couples to one or more memories-under-test (MUT) and writes signals to selected locations in the MUT. The written signals are subsequently read back and captured by the tester for comparison with expected signals. The failure results of the comparison generally dictate whether the MUT passed the test or requires repair.

Many memory devices employ redundant rows and columns for use in repairing the device should fails be detected during testing. This feature substantially improves the yields in the numbers of commercially acceptable devices. Conventional memory testers typically include one or more redundancy repair stations to physically replace one or more rows or columns with available redundant rows/columns. Before the redundancy analysis can take place, however, the reliable initial capture of the failure data by the tester must occur.

Traditionally, testers have initially stored failure data in RAM memories having overall capacities similar in size to the MUT. Commonly referred to as catchrams or error catch memories, the circuits typically store fail information at addresses that physically correspond to the address locations within predetermined regions of the MUT. This approach conveniently provides a bit-image representation of the MUT region (which may be the entire capacity of the MUT), allowing a user to quickly identify clusters of fails that might relate to a particular fabrication problem. This is particularly important in an engineering development environment to diagnose processing problems in fabricating MUTs early on. Quick identification of processing problems in a production line is also important to minimize any downtime on the line and maximize product throughput and corresponding lot yields.

One construction of a catchram utilizes a 1-bit wide SRAM having an overall storage capacity substantially equivalent to that of a MUT. Known for it's relatively high speed of operation in random mode, the SRAM provides a desirable memory type from the standpoint of operation. Unfortunately, SRAM production has dropped in recent years, with future availability doubtful. Consequently, the cost of an SRAM device is fairly high.

In an effort to create an SRAM-less catchram, those skilled in the art have utilized various DRAM implementations. DRAMs are relatively inexpensive and generally provide large capacity memories suitable for bit-image catchram applications in some circumstances. The devices include selectable modes of operation according to either a random mode (interleave) or burst mode (sequential). Unfortunately, in the random mode, DRAMs operate at substantially slower speeds than SRAM devices, requiring special techniques in order to operate successfully in catchram applications.

One proposal for using DRAMS in a failure capture memory, disclosed in U.S. Pat. No. 5,790,559 to Sato, employs a large number of banks of interleaved DRAMs to achieve acceptable speeds of operation during the DRAM random (interleaving) mode. The banks each have an overall storage capacity equivalent to that of the MUT and produce outputs that are interleaved to generate a faster serial bitstream. As an alternative to the random mode of operation, the patent also discloses a technique that uses the DRAM burst mode in combination with an address converter to simultaneously store multiple bits of fail data sequentially in the DRAM memory banks.

While the Sato proposals appear beneficial for their intended applications, they employ many banks of DRAM devices for each MUT, with the appearance of no real guarantee of a non-random mode operation. For example, if a read of the MUT involves switching rows or columns a number of times, the operation approaches a slower random-type mode. This defeats the use of the DRAM burst feature. To address this problem, it is believed that the Sato implementations require an undesirably high number of DRAM banks, or in the alternative require specialized test patterns. Implementing special test patterns is not only costly from a development standpoint, but problematic because of the limited number of devices that could be tested.

Conventional semiconductor testers also typically provide a testhead construction that positions arrays of pin electronics boards into close proximity to the DUT's to minimize propagation delays and related effects. The pin electronics boards generally include the capture and compare circuitry necessary to extract and detect the failures for the catchram memory. The typical testhead/mainframe construction generally results in a fairly large cable bundle that interconnects the testhead with the tester mainframe (where the catchram memories usually reside). The cable bundle is not only difficult to manipulate, but costly in terms of the actual cable expense and the overall tester "footprint" within the manufacturing clean room. With proposed semiconductor devices requiring 1024 channels or more, the number of cables necessary to support conventional testhead constructions becomes problematic.

Another problem with conventional ATE failure processing systems involves the transfer time of the failure data from the testhead to the mainframe (over the cable bundle), and from the output of the failure memory to the repair analysis circuitry, commonly referred to as redundancy analyzers (RAs). Typically, the system pattern generator drives the transfer of data from the memory to the RA during a brief "holding" period (where no capture of data occurs). This is believed to undesirably extend the time required to test a DUT, consequently reducing throughput.

A related problem to the transfer of data between the memory and the RA for conventional testers involves the routing of the memory output to a particular RA. Generally, regions or "slices" of conventional catchram memory configurations have respective outputs hard-wired to predetermined. RA's. This construction has been determined to unnecessarily limit the transfer bandwidth and cause other undesirable transfer restrictions.

What is needed and heretofore unavailable is a catchram memory construction that provides the capability of reconstructing a bit image map of the failure data from one or more MUTs with minimal hardware cost. Moreover, the need exists for such a circuit construction that also provides maximum data transfer rates with minimal cost. The failure capture circuit and method of the present invention satisfies these needs.

SUMMARY OF THE INVENTION

The failure capture circuit of the present invention reduces costs involved in capturing and analyzing failure data from a memory-under-test (MUT). This is accomplished by implementing a minimal number of DRAM banks that are configured to allow the transfer of output failure data via an interleave mode of operation. Moreover, the transfer of failure data to and from the memory banks is carried out at high speed to minimize test time.

To realize the foregoing advantages, the invention in one form comprises a failure capture circuit for use in a failure processing circuit to identify failure location information from a memory-under-test (MUT). The failure capture circuit includes failure detection circuitry comprising a plurality of channels and adapted for coupling to the MUT. The failure detection circuitry is operative to apply test signals to the MUT and process output signals therefrom into failure information. Memory is provided in the failure capture circuit having a capacity corresponding to a predetermined portion of the MUT. A high-speed link couples the memory to the failure detection circuitry.

In another form, the invention comprises a failure capture circuit for use in a failure processing circuit to identify failure location information from a memory-under-test (MUT). The failure capture circuit includes failure detection circuitry comprising a plurality of channels and adapted for coupling to the MUT. The failure detection circuitry is operative to apply test signals to the MUT and process output signals from the MUT into failure information. The failure capture circuit further includes a failure memory circuit having memory comprising a plurality of memory banks. The banks have substantially similar address rows and columns and are configured to receive the failure signals in a random mode. The failure memory circuit also includes reconcile circuitry coupled to respective burst mode outputs in the banks and having a reconcile path to the bank inputs. The reconcile circuitry is operative to, after the banks have captured a predetermined amount of data, ensure that each of the substantially similar addresses of the banks contains the same data.

In yet another form, the invention comprises a failure processing circuit for determining failure data from a MUT and analyzing the failure data to repair the MUT. The failure processing circuit includes a failure capture circuit having failure detection circuitry responsive to a first pattern generator and adapted for coupling to the MUT. The failure detection circuitry is operative to apply test signals to the MUT and process output signals from the MUT into failure information. The failure capture circuit further includes a failure memory circuit having a storage capacity corresponding to predetermined portions of the MUT and output transfer circuitry. Redundancy analysis circuitry is included to establish a procedure for repairing the MUT along with a second pattern generation circuit. The second pattern generation circuit is operative to support the transfer of failure data along the output transfer circuitry independent from the first pattern generator.

A further form of the invention comprises a failure capture circuit for use in a failure processing circuit to identify failure location information from a memory-under-test (MUT). The failure capture circuit includes failure detection circuitry comprising a plurality of channels. The failure capture circuit is adapted for coupling to the MUT and operative to apply test signals to the MUT and process output signals from the MUT into failure information. A failure memory circuit is included that has a capacity corresponding to a predetermined portion of the MUT and further includes slice circuitry corresponding to predetermined MUT storage regions. The failure memory circuit also includes transfer circuitry comprising an output selector for routing the slice output to the redundancy analysis circuitry.

In another form, the invention comprises a method of acquiring multiple channels of failure information from a MUT for subsequent redundancy analysis. The method includes the steps of capturing the failure information in a testhead failure capture circuit; and serially transmitting the captured failure information along a high speed link to a failure memory circuit having a memory capacity corresponding to a predetermined portion of the MUT.

In yet another form, the invention comprises a method of acquiring multiple channels of failure information from a MUT for subsequent redundancy analysis. The method includes the steps of capturing the failure information in a testhead failure capture circuit; randomly storing the failure information in a failure memory circuit that includes a plurality of memory banks having respective burst mode outputs; and reconciling the failure data within the plurality of memory banks. The reconciling step includes the steps of bursting the failure information out of the plurality of memory banks to a cache memory, and bursting back the burst data from the cache memory to the plurality of memory banks such that each of the banks reflects the same failure information in like addresses.

In another form, the invention comprises a method of acquiring and processing multiple channels of failure information from a MUT. The method includes the steps of capturing the failure information with failure detection circuitry in conjunction with a first pattern generation circuit; storing the failure information in a memory having a capacity corresponding to a predetermined portion of the MUT; and transferring the failure information from the memory in conjunction with a second pattern generation circuit independent of the first pattern generation circuit.

In yet another form, the invention comprises a method of acquiring and processing multiple channels of failure information from a MUT. The method includes the steps of capturing the failure information with failure detection circuitry; storing the failure information in a memory having a capacity corresponding to a predetermined portion of the MUT; and selectively routing the failure information from the memory to a redundancy analysis circuit.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which

FIG. 5 is a partial schematic diagram of one embodiment of the failure capture circuit of FIG. 1.

DETAILED DESCRIPTION OF THE INVENTION

Figure 1:
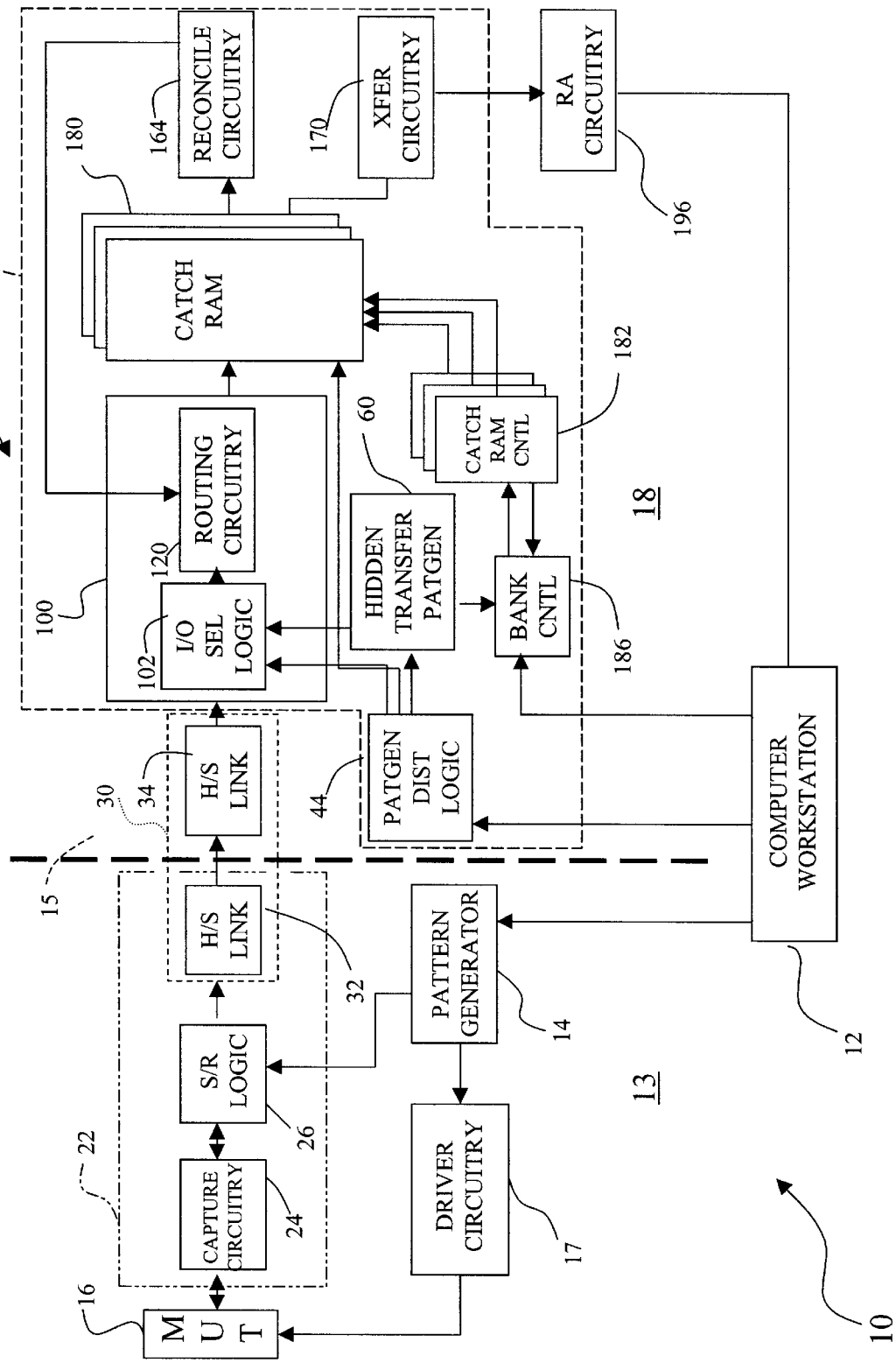
FIG. 1 is a generalized block diagram of a tester employing the failure capture apparatus of the present invention.

Referring now to FIG. 1, an abbreviated block diagram of a semiconductor memory tester according to one embodiment of the present invention, generally designated 10, includes a computer workstation 12, a tester/device interface such as a testhead 13 (shown as the compilation of circuitry to the left of the dashed line at 15), and mainframe circuitry 18 (shown as the compilation of circuitry to the right of the dashed line at 15).

The testhead houses the pin electronics that apply-signals to and capture signals from one or more memories-under-test (MUTs) 16. The pin electronics include pattern generation circuitry 14 responsive to pre-programmed pattern waveforms down-loaded from a pattern memory (not shown) in the workstation to generate address and data signals for writing and reading to and from the MUT. The signals generated by the pattern generator access the MUT through driver circuitry 17 and cause the MUT to write specified data to predetermined row and column address locations. A failure capture circuit, generally designated 20, subsequently accesses the MUT data in response to "read" signals generated by the pattern generator, and compares the data to expected values (also generated by the pattern generator) in an effort to identify defective memory cell locations within the MUT.

With continued reference to FIG. 1, the failure capture circuit 20 of the present invention employs failure detection circuitry 22 coupled to a failure memory circuit 40 via a high-speed link 30. The failure memory circuit includes a catchram memory 180 for storing failure data from one or more MUTs, a hidden transfer pattern generator 60 for transferring data from the memory, and reconcile circuitry 164 to process the catchram memory data. The reconcile circuitry reconfigures failure data in the catchram memory to facilitate an interleave mode output transfer capability to redundancy analyzer circuitry 196 that minimizes failure data processing times and correspondingly reduces test times.

Further referring to FIG. 1, the failure detection circuitry 22 includes capture circuitry 24 for coupling to the I/O pins (not shown) of the MUT 16. The capture circuitry comprises an array of comparators (not shown) that correspond to the individual pins of the MUT according to a configuration selected by I/O selection logic 102 included in the failure memory circuit 40. Each comparator feeds sync-reject logic 26 that generates sync-reject (SR) signals representative of a failed condition from a particular MUT pin during a particular cycle of operation.

The SR signals are fed to the high-speed link 30 that preferably comprises an LVDS clock recovery coder 32 at the testhead end 13, and a corresponding LVDS clock recovery decoder 34 at the mainframe end 18. The link transforms the SR data into a serial format suitable for transmission at high rates, and along a minimum number of signal paths or cables.

With continued reference to FIG. 1, the output of the high speed link deserializer 34 is directed to the input of the failure memory circuit 40. The failure memory circuit includes slice circuitry 100 for receiving and routing the SR data to the catchram memory 180. A "slice" represents a predefined portion or region of the failure memory for storage purposes. The slice circuitry includes the I/O selection logic 102 that receives the deserialized failure data, and routing circuitry 120 that directs the failure data, along with reconcile data from the reconcile circuitry 164, to the data inputs of the catchram memory.

Further referring to FIG. 1, the catchram memory 180 generally comprises a plurality of substantially identical SDRAM devices banked together and having respective interleaved outputs. Preferably, the memory (illustrated in FIGS. 1 and 4) includes a bank of seven SDRAM's, with each bank controlled by an individual memory controller 182. A bank control module 186 coordinates operation of the memory banks, and couples to the hidden transfer pattern generator 60. In order to organize the data captured by the individual SDRAM banks and allow an interleave-mode output transfer, the outputs from the memory feed the reconcile circuitry 164. After reconciliation, the outputs can then be coupled to interleave transfer circuitry 170. The reconcile circuitry generally ensures that all seven banks of the memory include the same data in the same address locations. This allows for a sequential (interleave) access for transfer purposes. The transfer circuitry selectively directs, at an interleave transfer rate, the reconciled memory output to desired portions of a redundancy analysis circuit 196.

Figure 2:
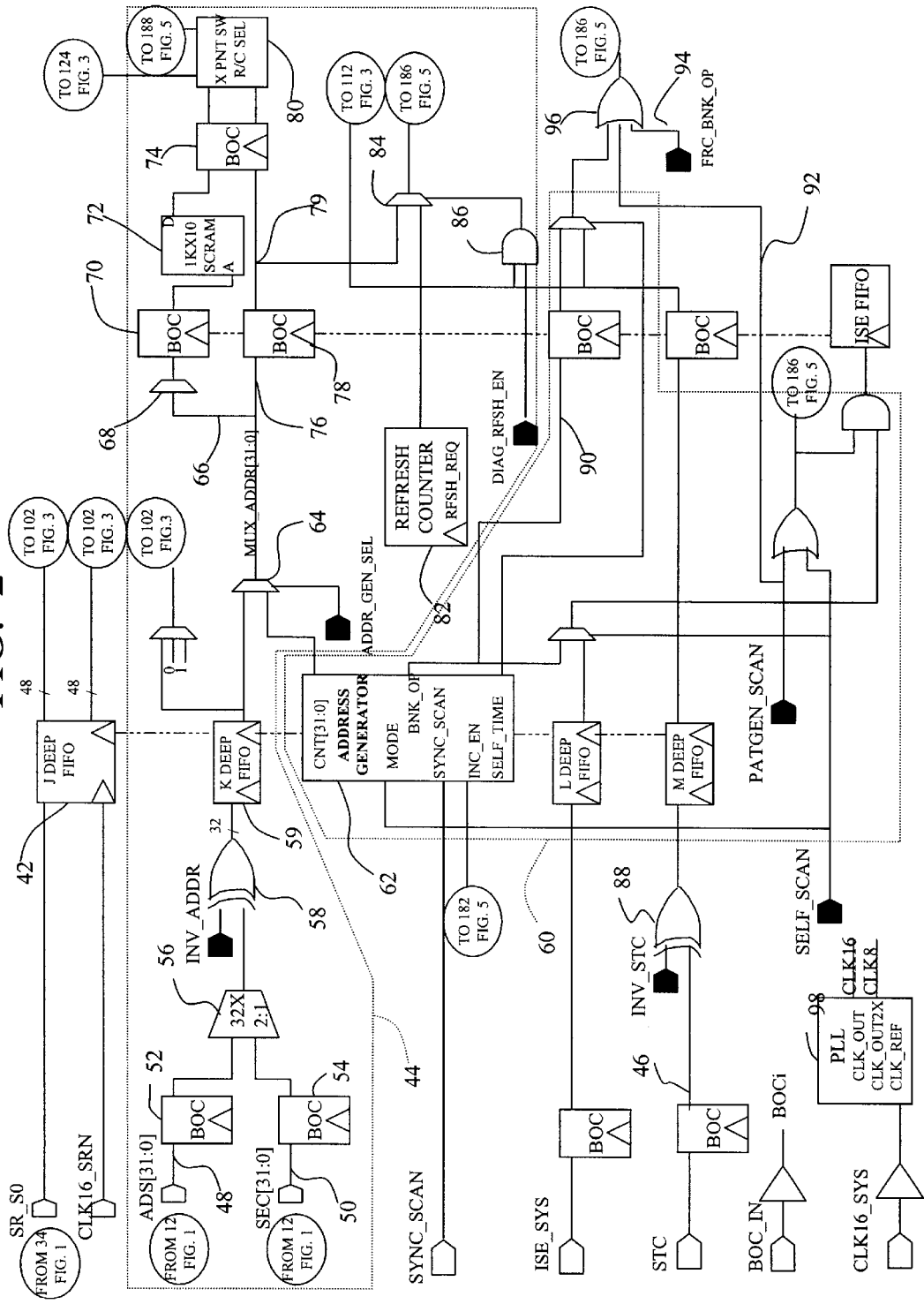
FIG. 2 is a partial schematic diagram of one embodiment of the failure capture circuit of FIG. 1.
Figure 3:
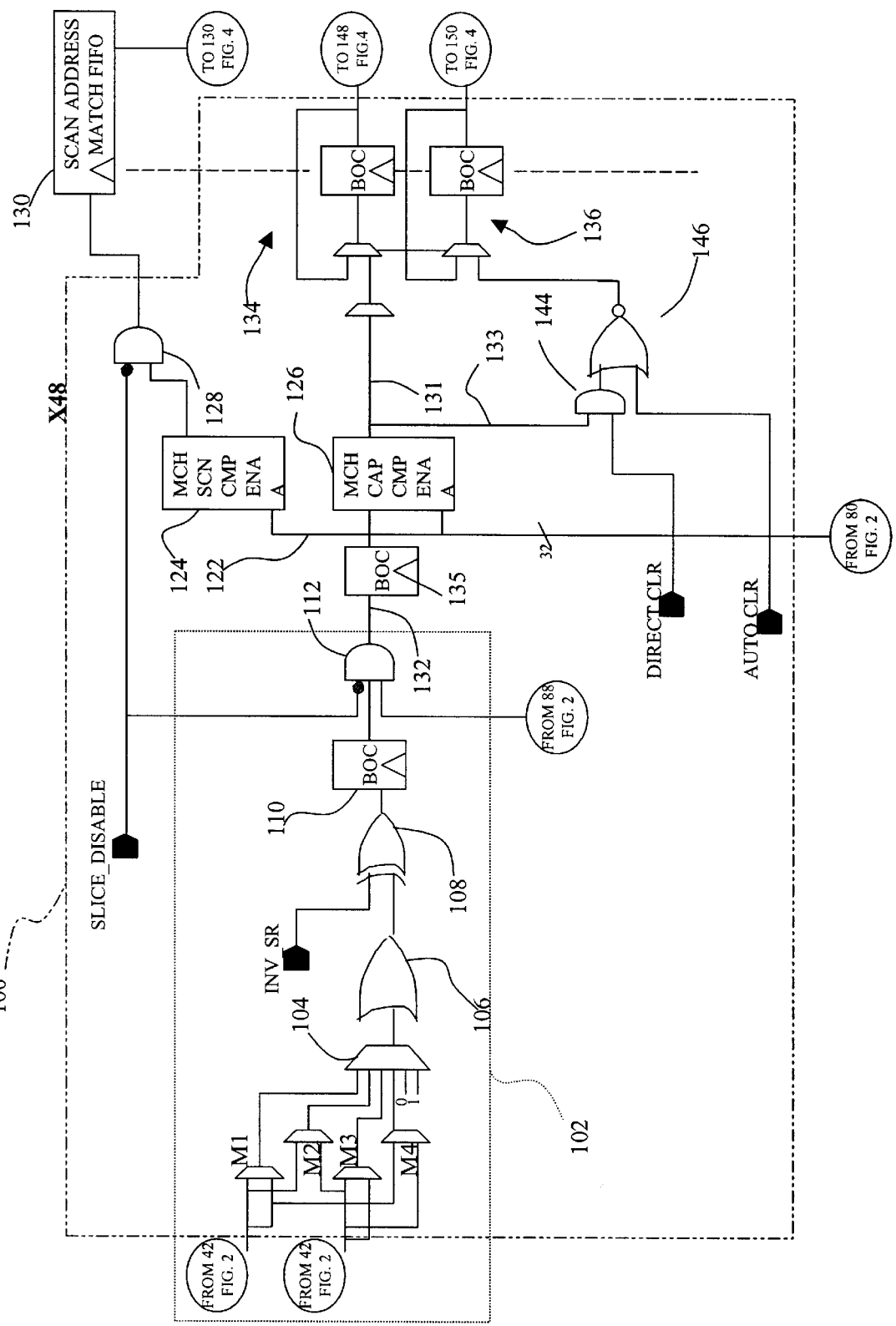
FIG. 3 is a partial schematic diagram of one embodiment of the failure capture circuit of FIG. 1.

Referring now to FIG. 2, and in greater detail than the generalized description above, one embodiment of the failure memory circuit 40 receives a plurality of input signals including SR_S0–SR_SN(sync-rejects 0 through N), CLK16_SRN (the sync reject clock), ADS[31:0] (alternative-data-source), SEC[31:0](secondary), SYNC_SCAN (synchronous scan), ISE_SYS (ignore serial error), STC (store this cycle), BOC_IN (beginning of cycle), and CLK16_SYS (system 16 nS period clock). The SR_S0 and CLK16_SRN signals are clocked through a first-in-first-out element 42 and routed to the slice circuitry 100 (FIG. 3).

With continued reference to FIG. 2, the input to the failure memory circuit 40 includes pattern distribution logic 44 that feeds address and data information to the slice circuitry 100. The pattern distribution logic cooperates with an STC (store-this-cycle) path 46 that alerts the logic when a pattern from the pattern generator 14 (FIG. 1) initiates and when to store data in the catchram memory 180 based on programmed conditions supplied by the pattern generator. Respective thirty-two bit alternative-data-source (ADS) and secondary (SEC) busses 48 and 50 transmit the respective ADS and SEC signals through respective registers 52 and 54 operating at the pattern generator clock (BOC). The busses feed thirty-two address-select multiplexers 56 that selectively pass single-bit outputs from one of the busses. An XOR gate 58 receives the source-select outputs and XORs them with inverted address signals INV_ADDR. A second FIFO module 59 pipes the XORed data synchronously with the first FIFO module 42. The output from the second FIFO is fed to the slice circuitry 100 as a multiplexer control input for multiplexers M1–M4 (FIG. 3), and as an input to an address multiplexer 64 described more fully below. The FIFO structures described in the failure capture circuit of the present invention preferably include respective flip-flops (not shown) disposed at the respective module data inputs and outputs, but may comprise, for example, latches or memories as is well known in the art.

The hidden transfer patgen circuitry 60 utilizes the SYNC_SCAN input signal as a command input for a hidden address generator 62. The address generator includes a thirty-two-bit counter that provides an input to the address multiplexer 64 that generates a multiplexed address line MUX_ADDR[31:0]. The address line directs the multi-bit address signals through respective scramble and non-scramble signal paths 66 and 76 to a row/column selector module 80. The scramble path includes a selector 68 coupled to a BOC register 70 that feeds a 1K×10 scramble RAM memory 72. The memory output couples to another BOC register 74 that connects to the row/column selector 80. The non-scramble path 76 comprises a third BOC register 78 that couples to the second BOC register 74. A refresh circuit samples the non-scrambled signal path at 79.

Figure 5:
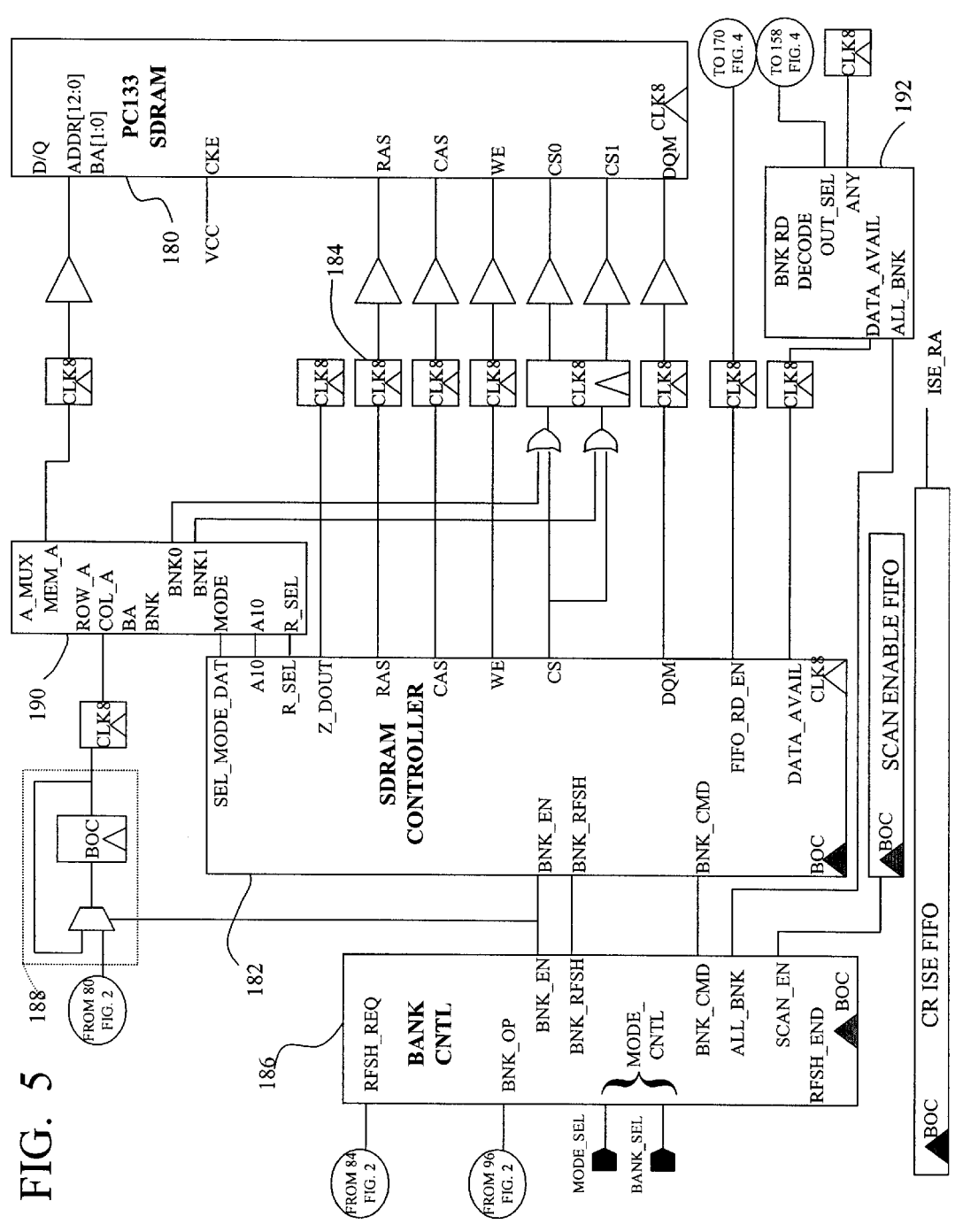

The refresh circuit includes a refresh counter 82 having an output fed as one of two inputs to a selector 84. The other input to the selector is sampled from the non-scrambled muxed address path 76. Control of the selector is carried out by an AND gate 86 having as its inputs respective control signals DIAG_RFSH_EN and the STC signal xored with an INV_STC by an XOR gate 88. The output of the refresh selector is directed to the bank controller 186 (FIG. 5).

Communication between the address generator 62 and the bank controller 186 is effected along a plurality of signal paths 90, 92 and 94 that result in an ORing of a BNK_OP signal (or the STC signal) with a PATGEN_SCAN signal (pattern generator scan), and an FRC_BNK_OP signal (force bank operation) by an OR gate 96. The output of the OR gate is directed to the BNK_OP input of the bank controller 186 (FIG. 5).

Further referring to FIG. 2, several clocking signals are utilized in the present invention and notated by BOC (beginning of cycle), or CLK16 (16 nS period clock) or CLK8 (8 nS period clock). The CLK16 and CLK8 clocks are synthesized from a phase-locked-loop module 98 that utilizes the system 16 nS clock as an input clock signal. For purposes of clarity, individual clock connections are not illustrated, but rather noted by the nomenclature above.

Referring now to FIG. 3, a portion of the slice circuitry 100 is illustrated (one of forty-eight identical circuits) including the I/O selection logic 102 and a portion of the routing circuitry 120. Sync reject signals from the output of the first FIFO 42 (FIG. 2) are distributed through a cross-coupled network of multiplexers M1–M4, and produce respective outputs terminating in a selector 104. The selector feeds an OR gate 106 that, in-turn couples to the input of an XOR gate 108. The XOR gate receives a secondary input from an inverted sync-reject signal INV_SR and produces an output directed through a BOC register 110 to an AND gate 112. The AND gate serves as the input to the routing circuitry 120, and also includes an inverted SLICE_DISABLE signal input and a third input from the STC signal path 46 (FIG. 2).

Figure 4:
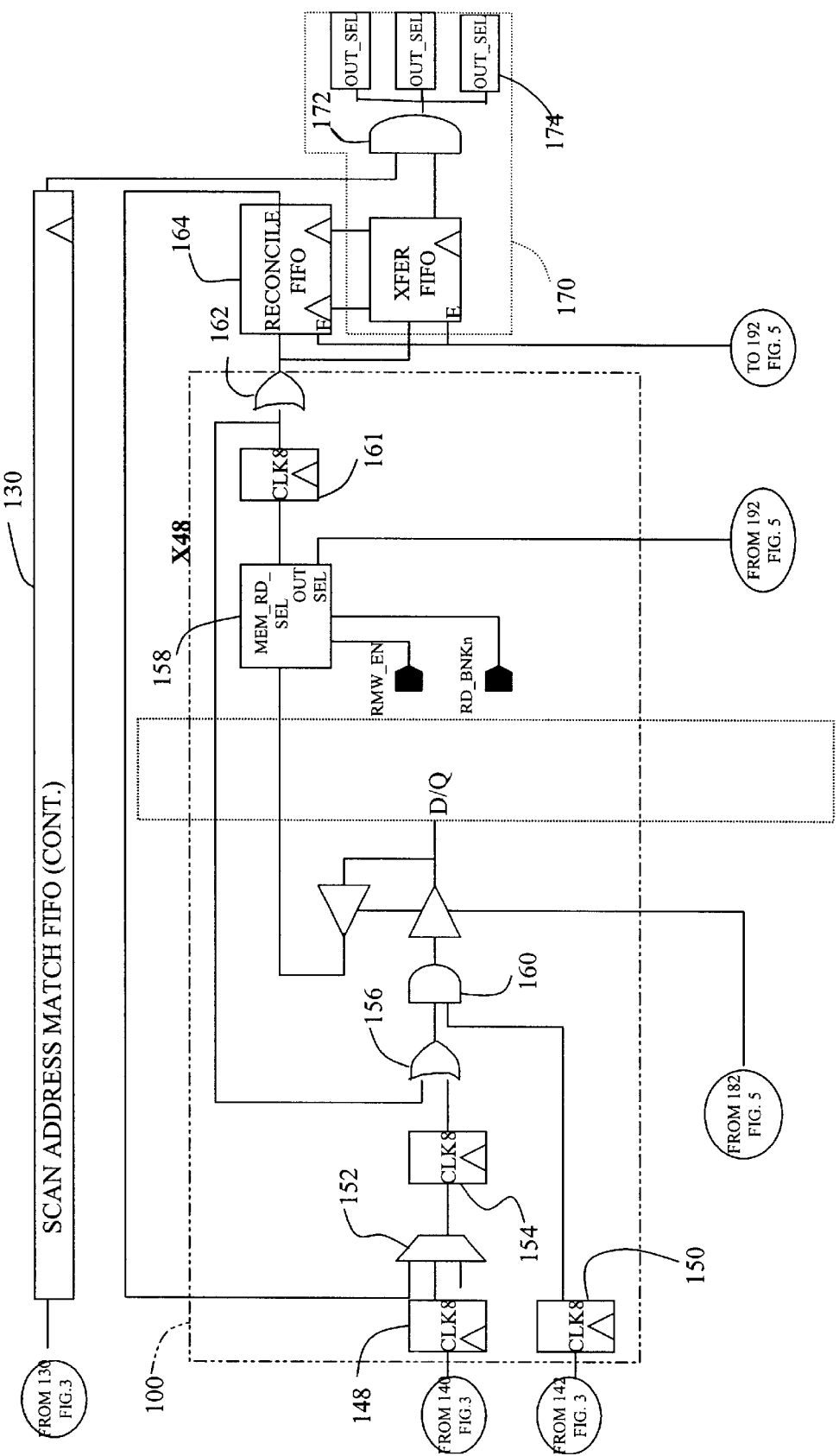
FIG. 4 is a partial schematic diagram of one embodiment of the failure capture circuit of FIG. 1.

Referring now to FIGS. 3 and 4, the routing circuitry 120 includes respective scan and capture data paths 122 and 132. The scan path includes a scan-compare register 124 that receives a 32-bit address input from the selector module 80 (FIG. 2) and feeds its output to an AND gate 128 for ANDing with an inverted SLICE_DISABLE signal. The ANDed result is then piped through a scan address match FIFO 130. The capture path 132 includes an input BOC register 135 and a capture-compare register 126 that also receives the 32-bit address information from the selector module 80. The capture-compare module processes the address information through respective primary and auxiliary data paths 131 and 133 that feed respective pipeline stage selectors having respective multiplexers. Each multiplexer is used to select which pipeline advances, based on which bank is operating. A convenient "clear" functionality is provided along the auxiliary path by a DIRECT_CLR signal that's ANDed with the 32-bit address comparison by an AND gate 144, and an AUTO_CLR signal NORed with the output of the AND gate 144 by NOR gate 146. The output of the NOR gate is directed to another pipeline stage selector array 136.

Referring now to FIG. 4, the outputs from the respective pipeline stage selector arrays 134 and 136 are re-clocked through respective 8 nS period registers (CLK8) 148 and 150. The output of the CLK8 register along the primary data path 131 feeds a 3:1 data selector 152. The data selector includes a reconcile data input from the reconcile circuitry 164 and a databus input DB from a databus (not shown). The selector output is clocked through a second CLK8 register 154 and fed to an OR gate 156 where it is ORed with "read" data from a "memory-read-select" module 158. The ORed output couples to an AND gate 160 that includes the "clear" command signals as an input, and then fed to the catchram memory input D/Q.

Further referring to FIG. 4, the memory-read-select module 158 responds to a read-modify-write signal RMW_EN, a bank read signal RD_BNKn, and an output control signal from a memory bank decoder 192 (FIG. 5). The module feeds a CLK8 register 160 and a slice output OR gate 162 before coupling to the reconcile circuitry 164.

With continued reference to FIG. 4, the reconcile circuitry 164 comprises a reconcile FIFO configured as a 256×48 cache memory. The transfer FIFO directs reconciled inter-leave data from the catchram 180 to an AND gate 172 for matching with data from the scan address match FIFO 130 and subsequent distribution to an array of pre-programmed output selectors 174. The output selectors each preferably comprise a set of AND gates (not shown) and associated enable inputs for each slice. the outputs of the AND gates feed a 48-input OR gate (not shown). The output of the OR gate is then used as the selector output signal OUT_SEL.

Turning now to FIG. 5, the catchram memory 180 responds to control circuitry, illustrated in further detail, including the memory controllers 182 (only one shown in FIG. 5 for clarity) for each catchram memory bank, the bank control module 186, and an address multiplexer 190.

Further referring to FIG. 5, each catchram memory bank 180 includes a plurality of control inputs often associated with SDRAM devices, such as ADDR (multiplexed address), RAS (row address strobe), CAS (column address strobe), WE (write enable), CS (chip select) and CKE (clock enable). The control inputs receive respective programmed control signals from an associated memory controller 182.

Each of the memory controllers 182 perform a variety of control functions including scanning the bank 180 for loading failure information, bursting the output to the reconcile circuitry 164, reading the reconciled data through the transfer circuitry 170, and refreshing the catchram. The control outputs from each controller to each bank of the catchram are re-clocked through an array of registers 184 operating at the high-speed 8 nS period clock (125 MHz). Other functions governed by the controller include memory reads for redundancy analysis transfer, and system read/writes for diagnostics.

Each memory controller 182 connects to the bank control module 186 that controls the entire catchram memory. The bank control module includes a plurality of control inputs for receiving respective refresh (RFSH_REQ), bank operation (BNK_OP), and mode control signals (MODE_SEL and BANK_SEL). The bank control module produces a variety of programmable outputs for coordinating the reading, writing and reconciling of data between the catchram memory banks 180. Command output signals to the memory controllers include bank-enable (BNK_EN), bank-refresh (BNK_RFSH), and bank-command (BNK_CMD). The bank-enable signal serves as the control input for a pipeline stage selector 188 associated with the address multiplexer 190. An all-bank (ALL_BNK) signal path couples the control module to a bank-read decoder 192.

The address multiplexer 190 converts 32-bit wide address data into a row, column, bank address, and physical bank address data format that can be used by the memory controllers 182. This is particularly beneficial due to the internal banking of memory cell arrays inside each SDRAM device.

Much of the structure of the failure capture circuit 20 (FIG. 1) described above lends itself well to implementation in an application specific integrated circuit (ASIC) form. This is particularly beneficial for parallel testing applications where a plurality of failure capture circuits are disposed in parallel to test a corresponding parallel array of MUTs. Because of the high-density advantages associated with ASIC technology, the circuitry space required to provide testing capabilities for a large number of MUTs is substantially reduced.

In general, operation of the failure capture circuit 20 involves capturing and processing failure data from the MUT 16 for subsequent high-speed transfer to the RA circuitry 196. Because of the desirability of bit-image analyses during the redundancy analysis, large amounts of failure data are often involved, requiring high-speed operation in order to maximize the throughput of MUT testing. Data received by the RA circuitry is analyzed according to methods well known to those skilled in the art, such as that disclosed in U.S. Pat. No. 5,754,556, entitled "Semiconductor Memory Tester With Hardware Accelerators", assigned to the assignee of the present invention and expressly incorporated herein by reference. The construction and configuration of the failure capture circuit, described above, allows for operation at high-speed with maximum device density and minimal hardware costs.

Prior to operation, the tester 10 is pre-programmed to write predetermined data to selected addresses in the MUT 16. This generally involves programming the pattern generator 14 to drive test pattern waveforms, such as return to zero, return to complement, and other test waveforms well known to those skilled in the art.

During a test, the pattern generator 14 supplies waveform information to the driver circuitry 17 and supplies a copy of the test signals to the failure capture circuit 20. The driver circuitry writes the programmed waveform to the MUT 16. After the driver circuitry 17 writes data to the MUT 16, the capture circuitry 24 scans selected areas of the MUT in response to subsequent pattern information, and reads the data from the selected area for comparison to the data previously sent by the pattern generator. The I/O selection logic 102 identifies predetermined MUT I/O pins for accessing, and steers data resources to those particular pins. This is particularly beneficial when testing a parallel array of MUTs.

The capture circuitry 24 activates in response to strobe signals generated by the pattern generator 14 to read the data from the MUT addresses selected by the I/O selection logic 102. The captured data is detected as logic high or low by each comparator (not shown) and fed to the sync-reject logic 26. The sync-reject logic then compares the detected logic level to the expected data supplied by the pattern generator. If the captured data matches the expected data, then the sync-reject logic output remains low. Should a mismatch occur, then the logic generates a sync-reject signal indicating a failed condition.

The captured failure data is then converted into serial form and processed through the high-speed link at high data rates. The serial data format provides a dramatic reduction in the number of cables necessary to route the SR signals between the testhead and the mainframe of the tester while also boosting the data transfer rate significantly.

Following the capture of the failure data, each memory bank sequentially undergoes a burst operation to output 256 addresses of data into the reconcile FIFO 164. The data from the seven banks is then ORed together and burst back into the same 256 address locations. The reconcile process sequentially repeats until all of the addresses in all seven banks are processed. In this manner, the data in each bank is the same on a per-address basis. This advantageously allows for an interleaved output capability during the data transfer to the RA circuitry 196.

After the failure data has been reconciled, the hidden transfer pattern generator 60 algorithmically generates a sequence of 32-bit (scrambled, if necessary) addresses for interleaved transmission sequentially from each bank to the RA circuitry 196. By implementing the hidden transfer pattern generator, output transfer times are no longer subject to the availability of the main tester pattern generator 14.

The actual transfer of the data from the failure capture circuit to the RA circuitry 196 also includes an output selector feature that provides flexibility in directing the selected slice outputs to the RA. Each slice output is directed to an associated AND gate (not shown) that's selectively enabled by a programmed enable signal. The respective AND gate outputs for all the slices are then ORed and subsequently transmitted in an interleave fashion to the RA circuitry 196.

Those skilled in the art will appreciate the many benefits and advantages afforded by the present invention. One of the more important advantages provided by the present invention is the reduced cost and time for data transfer between the tester mainframe and the tester testhead accomplished by the high-speed link. Moreover, significant benefits in memory performance are realized by the reconciling feature that enables an interleave-mode of output data transmission from the catchram memory to the redundancy analysis circuitry. Additionally, by providing a unique output selector circuit, advantages in flexibly directing slice outputs to an RA are achieved.

While the invention has been particularly shown and described with reference to the preferred embodiments thereof, it will be understood by those skilled in the art that various changes in form and detail may be made therein without departing from the spirit and scope of the invention.

What is claimed is:

1. A failure capture circuit for use in a failure processing circuit to identify failure location information from a memory-under-test (MUT), said MUT having a predetermined storage capacity comprising a plurality of memory cells, said failure capture circuit including:
   failure detection circuitry comprising a plurality of channels and adapted for coupling to said MUT and operative to apply test signals to said MUT and process output signals from said MUT into failure information;
   a failure memory circuit including
      slice circuitry including I/O selection logic and routing circuitry disposed at the output of said I/O selection logic;
      memory comprising a plurality of memory banks, said banks having substantially similar address rows and columns and configured to receive said failure signals in a random mode, said banks having respective burst mode inputs and outputs; and reconcile circuitry coupled to said respective burst mode outputs and having a reconcile path to said bank inputs and operative to, after said banks have captured a predetermined amount of data, ensure that each of said substantially similar addresses of said banks contains the same data; and a high-speed link coupling said failure memory circuit to said failure detection circuitry, wherein said high-speed link comprises a serial data link.

2. A failure capture circuit according to claim 1 wherein said failure detection circuitry is responsive to a first pattern generation circuit, said failure capture circuit further including:

transfer circuitry disposed at the output of said failure memory circuit; and a second pattern generation circuit coupled to said slice circuitry and operative to effect transfers of failure data from said failure memory circuit to redundancy analysis circuitry.

3. A failure capture circuit according to claim 2 wherein said transfer circuitry comprises:

an output selector for routing said slice output to a selected portion of said redundancy analysis circuitry.

4. A failure capture circuit for use in a failure processing circuit to identify failure location information from a memory-under-test (MUT), said MUT having a predetermined storage capacity comprising a plurality of memory cells, said failure capture circuit including:

failure detection circuitry comprising a plurality of channels and adapted for coupling to said MUT and operative to apply test signals to said MUT and process output signals from said MUT into failure information; and a failure memory circuit including memory comprising a plurality of memory banks, said banks having substantially similar address rows and columns and configured to receive said failure signals in a random mode, said banks having respective burst mode inputs and outputs, and reconcile circuitry coupled to said respective burst mode outputs and having a reconcile path to said bank inputs and operative to, after said banks have captured a predetermined amount of data, ensure that each of said substantially similar addresses of said banks contains the same data.

5. A failure capture circuit according to claim 4 wherein: said plurality of memory banks comprise a plurality of SDRAM memories.

6. A failure capture circuit according to claim 5 wherein said reconcile circuitry comprises:

a cache memory.

7. A failure capture circuit according to claim 6 wherein said cache memory comprises:

a FIFO circuit.

8. A failure capture circuit according to claim 4 and further including:

a high-speed link coupling said failure memory circuit to said failure detection circuitry.

9. A failure capture circuit according to claim 4 wherein said failure memory circuit includes:

slice circuitry including I/O selection logic and routing circuitry disposed at the output of said I/O selection logic.

10. A failure capture circuit according to claim 9 wherein said failure detection circuitry is responsive to a first pattern generation circuit, said failure capture circuit further including:

transfer circuitry disposed at the output of said failure memory circuit; and a second pattern generation circuit coupled to said slice circuitry and operative to effect transfers of failure data from said failure memory circuit to redundancy analysis circuitry.

11. A failure capture circuit according to claim 10 wherein said transfer circuitry comprises:

an output selector for routing said slice output to a selected portion of said redundancy analysis circuitry.

12. A failure processing circuit for determining failure data from a MUT and analyzing said failure data to repair said MUT, said failure processing circuit including:

a failure capture circuit including failure detection circuitry responsive to a first pattern generator and adapted for coupling to said MUT and operative to apply test signals to said MUT and process output signals from said MUT into failure information, and a failure memory circuit having a storage capacity corresponding to predetermined portions of said MUT and output transfer circuitry, the failure memory circuit further including a memory comprising a plurality of memory banks, said banks having substantially similar address rows and columns and configured to receive said failure signals in a random mode, said banks having respective burst mode inputs and outputs; and reconcile circuitry coupled to said respective burst mode outputs and having a reconcile path to said bank inputs and operative to, after said banks have captured a predetermined amount of data, ensure that each of said substantially similar addresses of said banks contains the same data;

redundancy analysis circuitry to establish a procedure for repairing said MUT; and a second pattern generation circuit operative to support the transfer of failure data along said output transfer circuitry independent from said first pattern generator.

13. A method of acquiring multiple channels of failure information from a MUT for subsequent redundancy analysis, said method including the steps of:

capturing said failure information in a testhead failure capture circuit;

randomly storing said failure information in a failure memory circuit, said failure memory circuit including a plurality of memory banks having respective burst mode outputs; and reconciling said failure data within said plurality of memory banks, said reconciling including the steps of bursting said failure information out of said plurality of memory banks to a cache memory, and bursting back said burst data from said cache memory to said plurality of memory banks such that each of said banks reflects the same failure information in like addresses.

* * * * *